(12) United States Patent
Wuu et al.

(10) Patent No.: US 12,445,120 B2
(45) Date of Patent: Oct. 14, 2025

(54) DYNAMIC SETUP AND HOLD TIMES ADJUSTMENT FOR MEMORIES

(71) Applicants: Advanced Micro Devices, Inc., Santa Clara, CA (US); ATI Technologies ULC, Markham (CA)

(72) Inventors: John J. Wuu, Fort Collins, CO (US); Jaroslaw Kuszczak, Markham (CA); Gaurav Singla, Markham (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 0 days.

(21) Appl. No.: 17/564,747

(22) Filed: Dec. 29, 2021

(65) Prior Publication Data
US 2023/0112432 A1 Apr. 13, 2023

Related U.S. Application Data

(60) Provisional application No. 63/254,873, filed on Oct. 12, 2021.

(51) Int. Cl.
*H03K 5/159* (2006.01)
(52) U.S. Cl.
CPC .................... *H03K 5/159* (2013.01)
(58) Field of Classification Search
CPC ..................................................... H03K 5/159
See application file for complete search history.

(56) References Cited

U.S. PATENT DOCUMENTS

| | | | |
|---|---|---|---|
| 9,536,591 B1* | 1/2017 | Kwak | G11C 5/025 |
| 2002/0178427 A1 | 11/2002 | Ding et al. | |
| 2003/0223278 A1 | 12/2003 | Gomm et al. | |
| 2006/0182150 A1* | 8/2006 | Ramsdale | G06F 3/1431 370/517 |
| 2009/0096483 A1* | 4/2009 | Kuhn | H03K 19/09429 326/56 |
| 2010/0001769 A1* | 1/2010 | Brantley | H03L 7/0818 327/144 |

(Continued)

OTHER PUBLICATIONS

International Search Report and Written Opinion in International Application No. PCT/US2022/077850, mailed Jan. 20, 2023, 15 pages.

*Primary Examiner* — Sibin Chen
(74) *Attorney, Agent, or Firm* — Kowert, Hood, Munyon, Rankin & Goetzel, P.C.; Rory D. Rankin

(57) ABSTRACT

A system and method for efficiently capturing data by sequential circuits across multiple operating conditions are described. In various implementations, an integrated circuit includes multiple signal arrival adjusters both at its I/O boundaries and across its die. The signal arrival adjuster includes two internal timing paths, each with a respective latency. The signal arrival adjuster receives an input signal, and generates an output signal from the a selected one of the first timing path and the second timing path. The signal arrival adjuster sends the output signal to a sequential circuit. The sequential circuit uses the output signal as one of an input data signal and an input clock signal. The selection between the two timing paths within the signal arrival adjuster aids satisfying the setup and hold time requirements of the sequential circuit.

20 Claims, 6 Drawing Sheets

(56) References Cited

U.S. PATENT DOCUMENTS

| | | | |
|---|---|---|---|
| 2010/0134169 A1* | 6/2010 | Okubo | G11C 7/22 |
| | | | 327/263 |
| 2010/0162258 A1* | 6/2010 | Muraki | G01R 31/31725 |
| | | | 718/104 |
| 2013/0249612 A1 | 9/2013 | Zerbe et al. | |

* cited by examiner

DYNAMIC SETUP AND HOLD TIMES ADJUSTMENT FOR MEMORIES

CROSS REFERENCE TO RELATED APPLICATIONS

This application claims priority to Provisional Patent Application Ser. No. 63/254,873, entitled "DYNAMIC SETUP AND HOLD TIMES ADJUSTMENT FOR MEMORIES" filed Oct. 12, 2021, the entirety of which is incorporated herein by reference.

BACKGROUND

Description of the Relevant Art

A variety of types of sequential circuits receive an input clock signal and additionally a data signal. These types of sequential circuits synchronize the processing of data signals in a pipelined fashion. Examples of these sequential circuits are latches, flip-flops, word line drivers, bit line drivers, data storage memory cells in random access memory, and so on. Generally, sequential circuits have an associated overhead including a setup time and a hold time. When either the setup time or the hold time is violated, the signals within the sequential circuit and an associated output value become metastable, or unpredictable. If the output value settles to an incorrect value, data corruption occurs. However, even if the output value settles to a correct value, power consumption has increased. Additionally, the latency increases for the circuitry of the subsequent combinatorial logic that receives the output value.

In addition, a system management unit determines the value of a power supply voltage and an operating clock frequency for a power-performance state of an integrated circuit while transitioning the integrated circuit between different operating modes or states. Examples of the operating modes are an awake state, an idle state, and a sleep state. Each operating mode is associated with one or more power-performance states. Using different power supply voltages and operating clock frequencies serves to balance tradeoffs between performance, power consumption, and stability of the integrated circuit. With the demand for increasing clock speeds for many integrated circuits, balancing setup and hold time requirements of sequential circuits for different operating conditions has become a challenge.

In view of the above, methods and systems for efficiently capturing data by sequential circuits across multiple operating conditions are desired.

Figure 1:
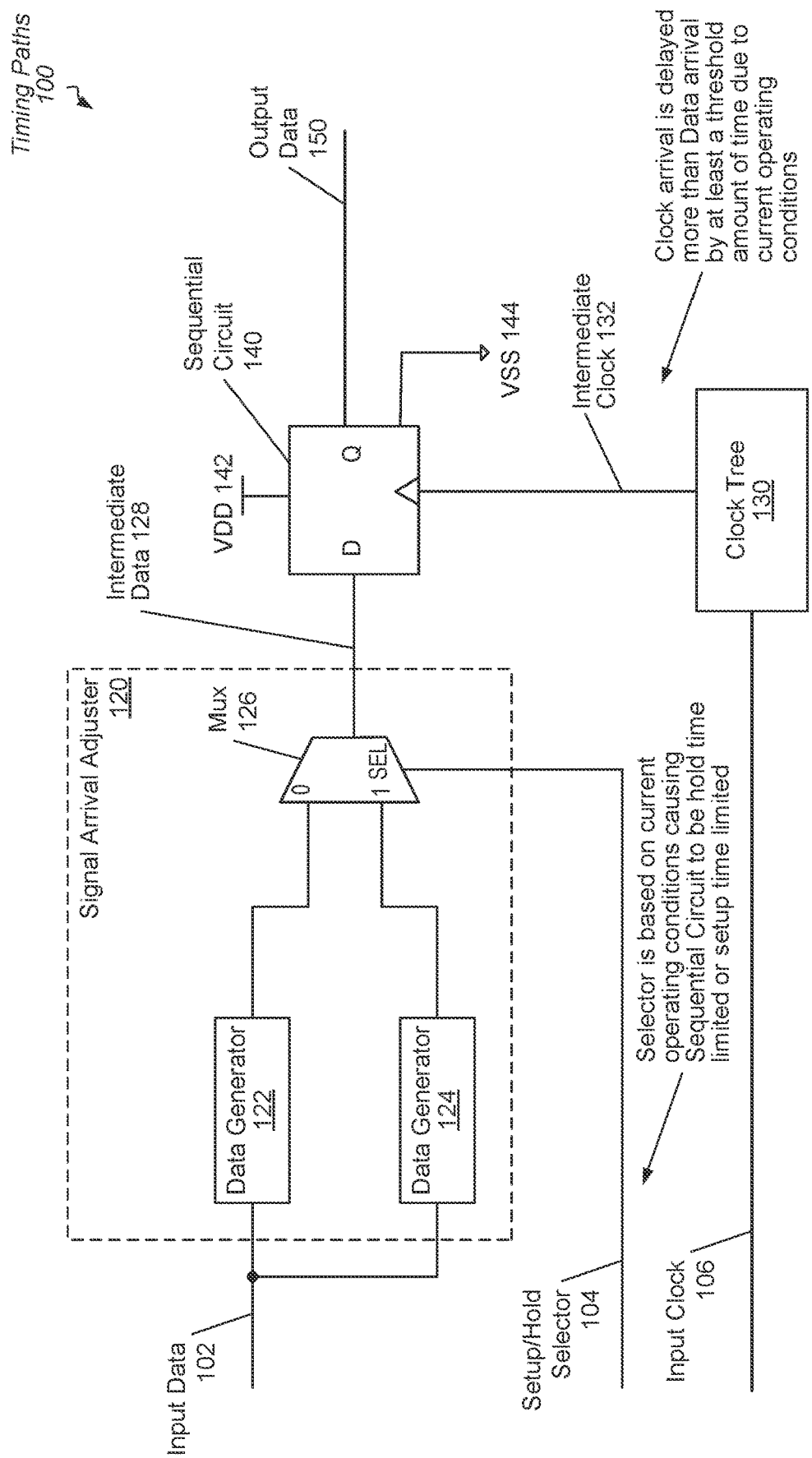
FIG. 1 is a generalized diagram of timing paths for efficiently capturing data by sequential circuits across multiple operating conditions.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficiently capturing data by sequential circuits across multiple operating conditions are contemplated. In various implementations, an integrated circuit includes multiple signal arrival adjusters both at its I/O boundaries and across its die. The signal arrival adjuster includes two internal timing paths, each with a respective latency. The signal arrival adjuster receives an input signal, and generates an output signal from a selected one of the first timing path and the second timing path. The signal arrival adjuster sends the output signal to a sequential circuit. In some implementations, the input signal and the output signal correspond to a data value to be stored by the sequential circuit. In other implementations, the input signal and the output signal correspond to a clock signal to be used by the sequential circuit.

The signal arrival adjuster also receives a setup/hold selector control signal (or control signal). In various implementations, a control unit generates the control signal based on a variety of operating conditions. The signal arrival adjuster (or adjuster) selects a first timing path with a first latency when the adjuster determines the control signal has a first state or value. The adjuster selects a second timing path with a second latency greater than the first latency when the adjuster determines the control signal is associated with a second state different than the first state. In various implementations, the second timing path includes one or more delay elements which increase the latency of a signal through the path when compared to the first timing path. In various implementations, the timing of the first timing path and the second timing path is less than or equal to a single clock cycle. The adjuster is placed in the signal path of the data signal or the clock signal of a sequential circuit to adjust the corresponding arrival time at the sequential circuit in order to satisfy both the setup time and the hold time requirements for particular operating conditions.

Examples of the operating conditions are the operating temperature, the multiple power-performance states (P-states), the operating power supply voltage, a monitored activity level, and so on. The current values of one or more of these conditions change the latencies of signals on the die. For example, the operating conditions are capable of affecting the resistive and capacitive (RC) parasitic effects of signal routes and the transistor threshold voltages. The change in latency of a particular signal is further based on whether its signal path includes more of a long signal route (e.g., a long wire) than transistors or includes more transistors providing multiple levels of combinatorial logic than long signal routes. Therefore, the change in latency of a data signal arriving at a sequential circuit can be different than a change in latency of a clock signal arriving at the sequential circuit.

A designer already tuned each of the data and clock signal paths to ensure both the setup time requirement and the hold time requirement are satisfied for the sequential circuit under particular operating conditions. However, due to the resulting changes in latencies of the data signal and the clock signal being significantly different from one another for other operating conditions, one or both of the setup and hold time requirements are no longer satisfied. Therefore, the adjuster is placed on the signal path of the data signal or the clock signal to adjust the arrival time at the sequential circuit in order to satisfy both the setup time and the hold time requirements for these other operating conditions. Under particular conditions, when the clock signal arrives at the sequential circuit later than the data signal at the sequential circuit, a hold time violation occurs at the sequential circuit. For example, if the difference between an arrival time at the sequential circuit of the input clock signal and an arrival time at the sequential circuit of the input data signal is greater than a threshold, a hold time violation occurs. In these cases, the signal arrival adjuster is used on the path of the data signal to remove the hold time limitation. Under particular conditions, when the data signal arrives significantly later than the clock signal at the sequential circuit, a setup time violation occurs at the sequential circuit. In these cases, the signal arrival adjuster is used on the path of the clock signal to remove the setup time limitation. The selection between the two timing paths within the signal arrival adjuster aids satisfying the setup and hold time requirements of the sequential circuit.

Turning now to FIG. 1, a generalized block diagram of timing paths 100 is shown. An integrated circuit includes multiple signal arrival adjusters such as the signal arrival adjuster 120. The integrated circuit is capable of using the signal arrival adjuster (or "signal arrival adjustment unit") 120 at its input/output (I/O) boundaries and across its die. In various implementations, the signal arrival adjuster 120 (or adjuster 120) receives the input data 102 and the setup/hold selector control signal 104. The adjuster 120 generates the intermediate data 128, and sends it to the sequential circuit 140. The sequential circuit 140 receives the intermediate data 128 and the intermediate clock 132. The clock tree 130 receives the input clock 106 and generates the intermediate clock 132. The sequential circuit also uses the power supply voltage level indicated as "VDD" 142 and the ground reference voltage level indicated as "VSS" 144. In various implementations, the values of VDD 142 and VSS 144 are set by a currently used power-performance state (P-state). In some implementations, the adjuster 120 also uses the same values of VDD 142 and VSS 144. In addition, the operating frequency of one or more of the input clock 106 and the intermediate clock 132 are based on the P-state. The sequential circuit 140 generates the output data 150.

The sequential circuit 140 is representative of a variety of sequential data storage elements. Examples of the sequential circuit 140 are latches, flip-flops, word line drivers, bit line drivers, data storage memory bit cells in random access memory, and so on. Generally, the sequential circuit 140 has an associated overhead including setup time and hold time requirements. In an implementation, the adjuster 120 includes two timing paths, each with a respective latency. For example, the adjuster 120 includes the data generators 122 and 124. A first timing path receives the input data 102, and uses the data generator 122 and the multiplexer (mux) 126 to generate the intermediate data 128. A second timing path receives the input data 102, and uses the data generator 124 and the multiplexer (mux) 126 to generate the intermediate data 128. The select line of the multiplexer 126 receives the setup/hold selector 104. Although two timings paths are shown which use the data generators 122 and 124, in other implementations the adjuster 120 includes another number of timings paths using another number of data generators. In such implementations, the number of multiplexers and the number of control signals increase.

In an implementation, the data generator 122 has a latency less than a latency of the second data generator 124. In one example, the data generator 122 uses a wire delay and no logic gate delays, whereas, the data generator 124 uses an even number of inverters (i.e., 2, 4, 6, etc.) connected in a serial manner to send a delayed, non-inverted, value of the input data 102 to the multiplexer 126. In other implementations, the data generators provide inverted values to the multiplexer 126, and an additional inverter is used on the output of the multiplexer 126. The multiplexer 126 selects the first timing path that uses the data generator 122 when the setup/hold selector 104 indicates that the "0" input of the multiplexer 126 is to be selected. An control unit (which may be external to the apparatus) sets the setup/hold selector 104. The control unit sets the setup/hold selector 104 to a value that indicates that the data generator 122 should be selected when the control unit determines current operating conditions cause a difference to be less than a time threshold between an arrival time at the sequential circuit of the input data 102 and an arrival time at the sequential circuit of the intermediate clock 132. Therefore, the setup and hold time requirements of the sequential circuit 140 are able to be met by these arrival times due to prior tuning during a design cycle.

The multiplexer 126 selects the second timing path that uses the data generator 124, which has a latency greater than a latency of the data generator 122, when the setup/hold selector 104 indicates that the "1" input of the multiplexer 126 is to be selected. The control unit sets the setup/hold selector 104 to a value that indicates that the data generator 124 should be selected when the control unit determines current particular operating conditions cause the arrival time of the intermediate clock 132 to lag behind the arrival time of the input data 102 by at least the time threshold. Therefore, the hold time requirement of the sequential circuit 140 is unable to be met during these particular operating conditions. The data generator 124 aids satisfying the hold time requirement of the sequential circuit 140 under these particular conditions. The latency of the data generator 124 causes the difference of the arrival times of the intermediate data 128 and the intermediate clock 132 to be less than a time threshold. Accordingly, the hold time requirement of the sequential circuit 140 is met.

Examples of the operating conditions monitored by the control unit are the operating temperature, the multiple power-performance states (P-states), the operating voltage, a monitored activity level, and so on. The current values of one or more of these conditions change the latencies of signals on the die such as the arrival times of input data 102 and intermediate clock 132. For example, the operating conditions are capable of affecting the resistive and capacitive (RC) parasitic effects of signal routes and the transistor threshold voltages. The combination of particular operating conditions is known that cause the arrival time of the intermediate clock 132 to lag behind the arrival time of the input data 102 by at least the time threshold. When the known combination is used by the integrated circuit, the control unit sets the setup/hold selector 104 to a value that indicates to the multiplexer 126 to select the data generator 124.

In some implementations, the control unit includes hardware, such as circuitry, that receives indications of operating conditions and determines when the one or more combinations occur that cause a hold time violation for the sequential circuit 140. For example, a power manager or other management unit provides the selected P-states. One or more of a variety of types of temperature sensors provide an indication of the operating temperature. The hardware of the control unit that generates the setup/hold selector 104 for the sequential circuit 140 is particular to this sequential circuit 140. However, if other sequential circuits nearby the sequential circuit 140 have similar signal timings, then other signal arrival adjusters used with these other sequential circuits can share the setup/hold selector 104. In other implementations, the control unit maintains a configurable table in hardware or firmware that identifies the combination of one or more operating conditions that cause a hold time violation for the sequential circuit 140. The control unit sends the setup/hold selector 104 as an output of this table to one or more signal arrival adjusters such as the adjuster 120.

The placement of the signal arrival adjuster 120 is based on which signal (e.g., input data signal 102 and intermediate clock signal 132) arrives later at the sequential circuit 140 when the difference between the arrival times at the sequential circuit 140 of the input data 102 and of the intermediate clock 132 is equal to or greater than a time threshold. In the illustrated implementation, the adjuster 120 is placed in the signal path of input data 102, since under particular operating conditions, the arrival time of the intermediate clock 132 lags behind the arrival time of the input data 102 by at least the time threshold. However, in other implementations, when the arrival time of the input data 102 lags behind the arrival time of the intermediate clock 132 by at least the time threshold under particular operating conditions, the adjuster 120 is placed in the signal path of the intermediate clock 132. In such cases, the sequential circuit 140 is unable to satisfy the setup time requirement. Therefore, the control unit sets the setup/hold selector 104 to select the data generator 124, which further delays the arrival time of the intermediate clock 132. Accordingly, in these cases, the setup time requirement is now satisfied, since the difference of the arrival times of the input data 102 and the intermediate clock 132 is less than the time threshold.

Figure 2:
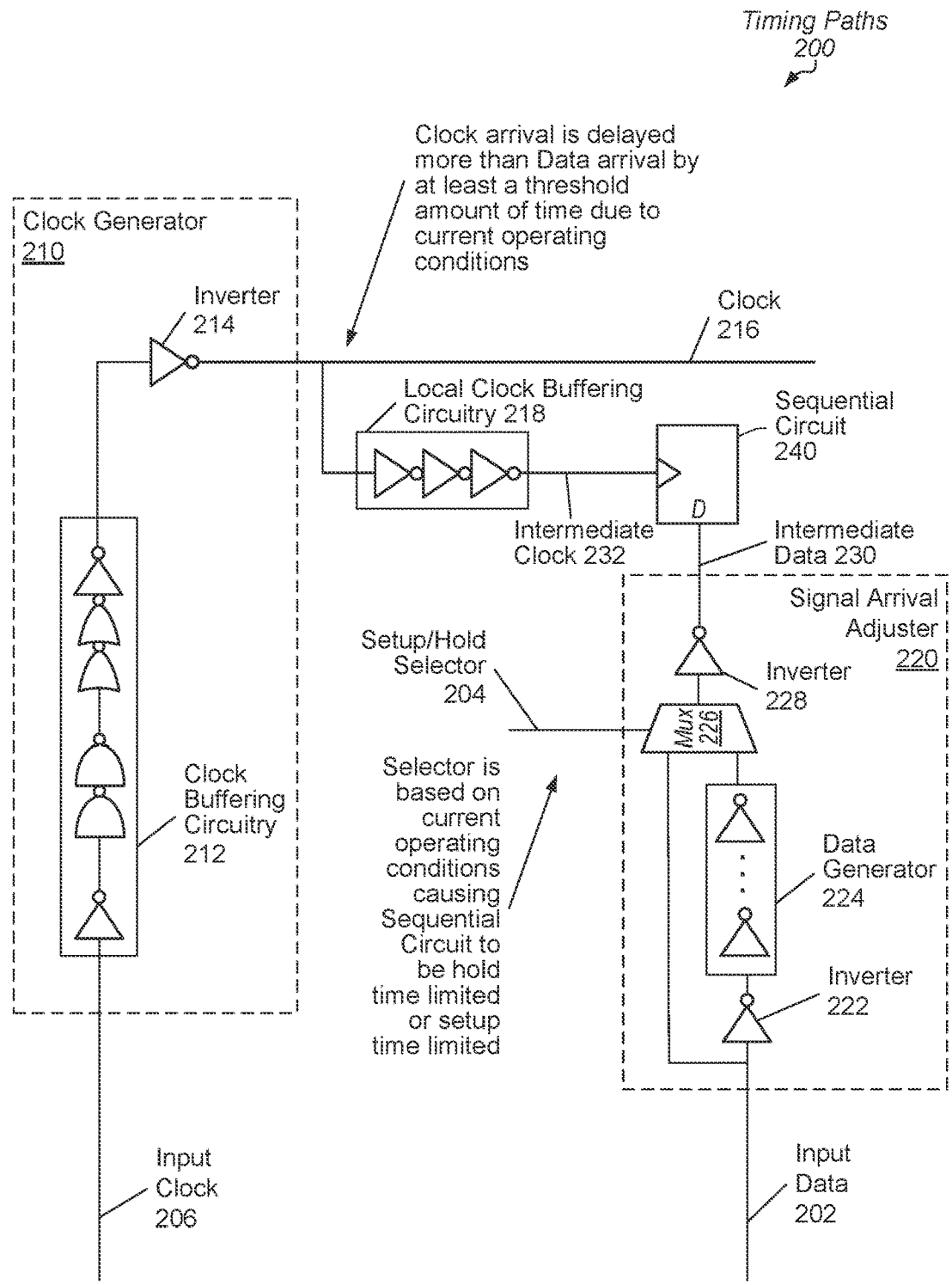
FIG. 2 is a generalized diagram of timing paths for efficiently capturing data by sequential circuits across multiple operating conditions.

Referring to FIG. 2, a generalized block diagram of timing paths 200 is shown. The timing paths 200 include similar components as shown for timing paths 100 (of FIG. 1). For example, the clock generator 210 receives an input clock signal input clock 206 and generates the clock signal 216, which is received by the local clock buffering circuitry 218 (or circuitry 218). The output of circuitry 218 is the intermediate clock signal 232, which is received by the sequential circuit 240. The clock generator 210 uses the clock buffering circuitry 212 (or circuitry 212), which includes one or more Boolean combinatorial logic gates and complex gates. Other control signals used by the circuitry 212 are not shown for ease of illustration. The inverter 214 is a global clock buffer that sends the clock signal 216 to various types of circuits.

As described earlier, the placement of the signal arrival adjuster 220 (or adjuster 220) is based on which signal (e.g., input data signal 202 and intermediate clock signal 232) arrives later at the sequential circuit 140 when the difference of the arrival times of the input data 202 and the intermediate clock 232 is equal to or greater than a time threshold. In the illustrated implementation, the adjuster 220 is placed in the signal path between the input data signal 202 and the sequential circuit 240, since under particular operating conditions, the arrival time of the intermediate clock 232 lags behind the arrival time of the input data 202 by at least the time threshold. Therefore, under these particular operating conditions, the hold time requirement of the sequential circuit 240 is unable to be met without the use of the adjuster 220. The adjuster 220 generates the intermediate data signal 230, which is received by the sequential circuit 240. The adjuster 220 includes two timing paths. A first timing path includes a wire delay with no logic gate additional delay, whereas, a second timing path includes a series of inverters that buffer and delay the input data signal.

As described earlier, a control unit 250 asserts the setup/hold selector 204 signal based on determining when a particular combination of operating conditions occur that cause the arrival time of the intermediate clock 232 to lag behind the arrival time of the input data 202 by at least the time threshold. In various implementations, the control unit 250 may be part of power management circuitry, receive information from power management circuitry, or otherwise. Otherwise, the control unit negates the setup/hold selector 204 signal. When the setup/hold selector 204 signal is negated, the multiplexer 226 of the adjuster 220 selects the first timing path that uses only the wire delay. The wire delay of the first timing path aids in satisfying the setup time requirement of the sequential circuit 240. When the setup/hold selector 204 signal is asserted, the multiplexer 226 of the adjuster 220 selects the second timing path that uses the inverter 222 and the data generator 224. The data generator 224 uses a series of inverters to add delay. The series of inverters aids in satisfying the hold time requirement of the sequential circuit 240. Although two timings paths are shown, in other implementations, the adjuster 220 includes another number of timings paths using another number of data generators. In such implementations, the number of multiplexers and the number of control signals increase for the adjuster 220.

The circuitry shown for timing paths 200 leverages the typical, existing infrastructure for selecting different modes for the peripheral circuitry of synchronous random access memories (SRAMs) such as the registers that store the write data. With different operating power supply voltage ranges, different operating temperature ranges, and so on, dynamically satisfying the setup requirements and the hold requirements for the sequential circuits becomes challenging. For example, methods that allow signals to satisfy the hold time requirements within sequential circuits without using the adjuster 220 would incur a setup penalty under certain operating conditions. Similarly, methods that allow signals to satisfy the setup requirements within sequential circuits without using the adjuster 220 would incur a hold time penalty under certain operating conditions. The adjuster 220 uncouples these conflicting requirements, allowing both the hold time requirements and the setup time requirements to be met during a wide range of operating conditions.

Figure 3:
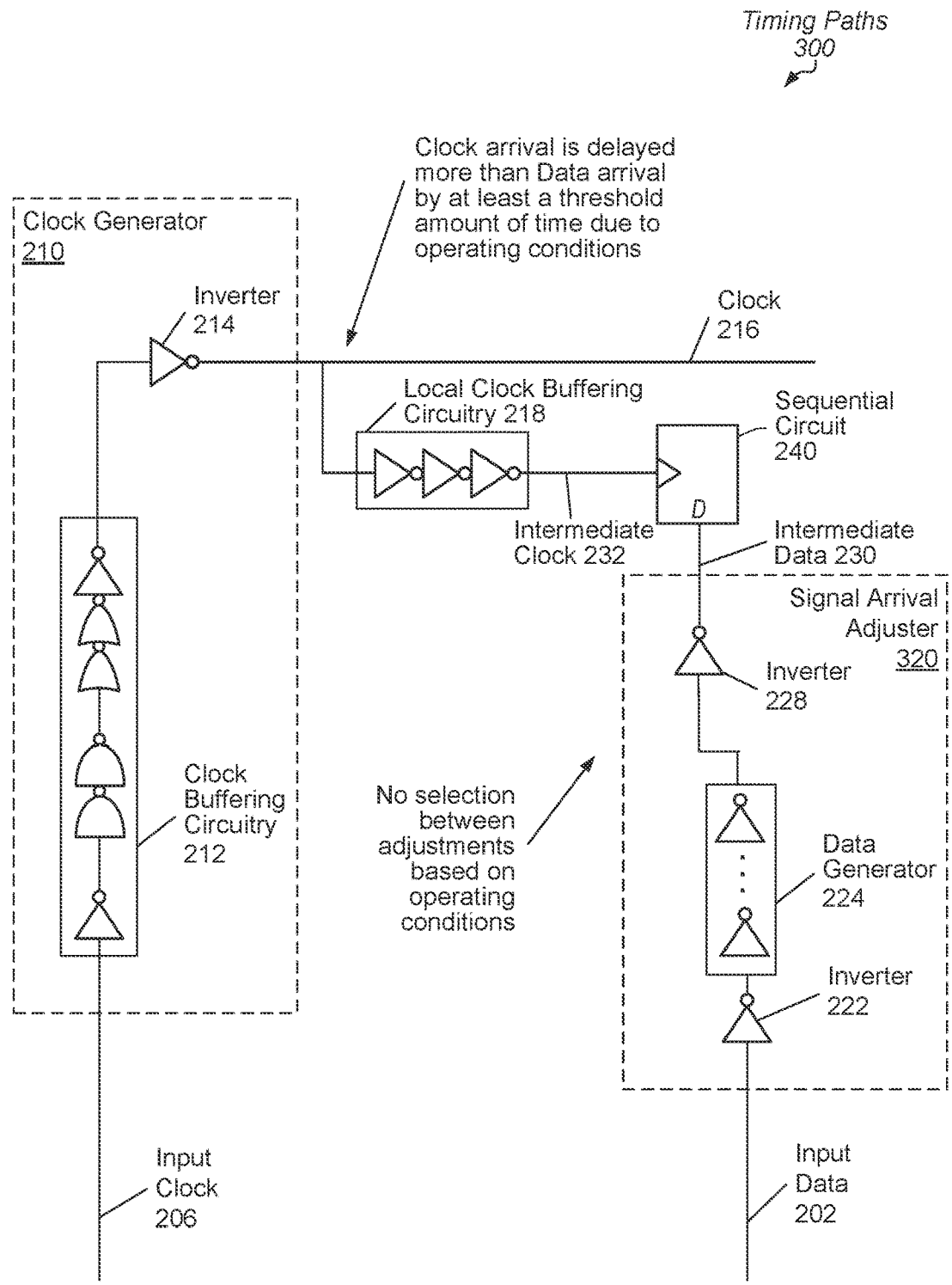
FIG. 3 is a generalized diagram of timing paths for capturing data by sequential circuits across multiple operating conditions.

Turning now to FIG. 3, a generalized block diagram of timing paths 300 is shown. The timing paths 300 includes similar components as shown for timing paths 200 (of FIG. 2). Circuits and signals described earlier are numbered identically. Here, the signal arrival adjuster 320 replaces the signal arrival adjuster 220. No selection of timing paths is performed. Accordingly, satisfying the setup and hold time requirements of the sequential circuit 240 becomes difficult as the operating parameters change as the operating mode changes.

Figure 4:
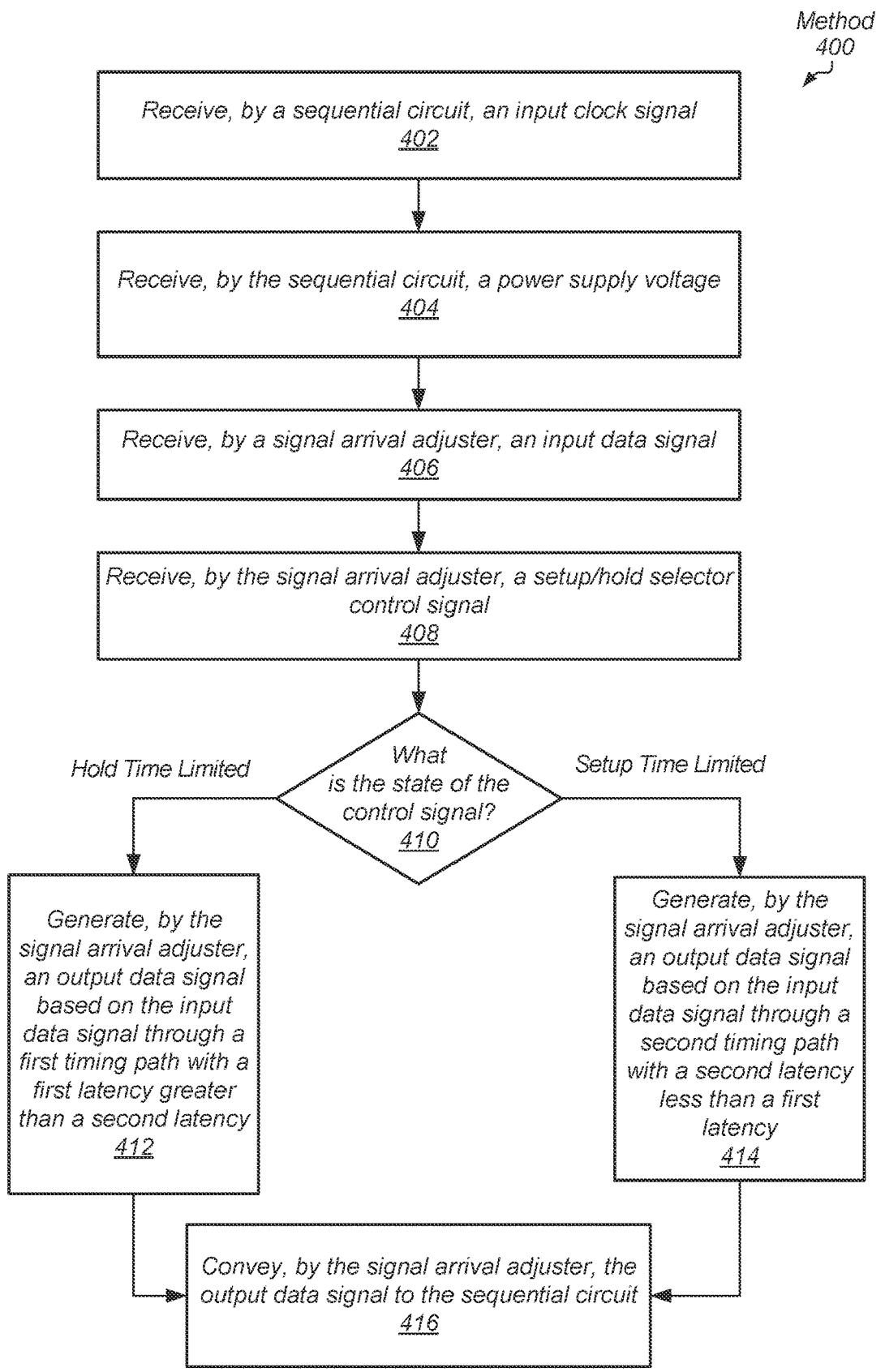
FIG. 4 is a generalized diagram of one implementation of a method for efficiently capturing data by sequential circuits across multiple operating conditions.

Referring now to FIG. 4, one implementation of a method 400 is shown for efficiently capturing data by sequential circuits across multiple operating conditions. For purposes of discussion, the steps in this implementation are shown in sequential order. However, in other implementations some steps occur in a different order than shown, some steps are performed concurrently, some steps are combined with other steps, and some steps are absent.

An integrated circuit includes multiple signal arrival adjuster both at its I/O boundaries and within its die. In various implementations, one or more of the signal arrival adjusters utilize the components of the signal arrival adjuster 120 (of FIG. 1) and the signal arrival adjuster 220 (of FIG. 2). A sequential circuit receives an input clock signal (block 402). Examples of the sequential circuit are latches, flip-flops, word line drivers, bit line drivers, data storage memory cells in random access memory, and so on. Generally, the sequential circuit has an associated overhead including setup time and hold time requirements. The sequential circuit receives a power supply voltage (block 404).

A signal arrival adjuster receives an input data signal (block 406). The signal arrival adjuster receives an indication of a setup/hold selector control signal (block 408). In various implementations, a control unit identifies the combination of one or more operating conditions that cause a hold time violation for the sequential circuit. For example, a difference is greater than a time threshold between an arrival time at the sequential circuit of the input clock signal and an arrival time at the sequential circuit of the input data signal. In such cases, the sequential circuit is "hold time limited." If the state of the control signal indicates the sequential circuit is hold time limited ("hold time limited" branch of the conditional block 410), then the signal arrival adjuster generates an output data signal based on the input signal through a first timing path with a first latency greater than a second latency (block 412). For example, the first latency of the first timing path within the signal arrival adjuster is greater than a second latency of a second timing path with the signal arrival adjuster.

In various implementations, the control unit also identifies the combination of one or more operating conditions that cause a setup time violation for the sequential circuit. For example, a difference is greater than a time threshold between an arrival time at the sequential circuit of the input data signal and an arrival time at the sequential circuit of the input clock signal. In such cases, the sequential circuit is "setup time limited." If the state of the control signal indicates the sequential circuit is setup time limited ("setup time limited" branch of the conditional block 410), then the signal arrival adjuster generates an output data signal based on the input signal through a second timing path with a second latency less than a first latency of the first timing path of the signal arrival adjuster (block 414). The signal arrival adjuster (or adjuster) conveys the output data signal to the sequential circuit (block 416). For example, the sequential circuit receives the output data signal as its input data signal. Due to the received state of the control signal, the adjuster provides a difference between the arrival times at the sequential circuit of the output data signal and of the clock signal to be less than a time threshold. Therefore, both the setup time and the hold time requirements of the sequential circuit are met.

Figure 5:
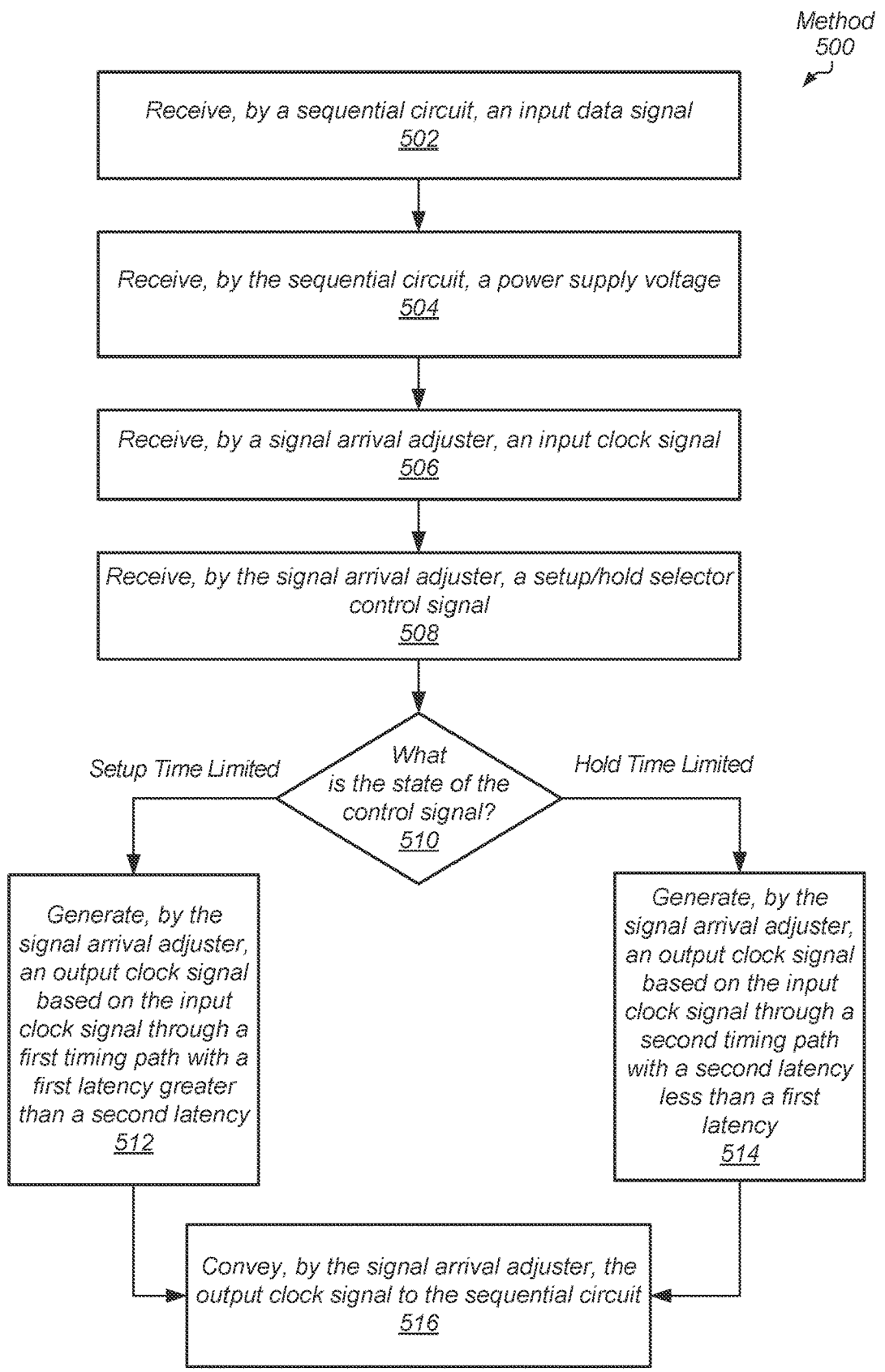
FIG. 5 is a generalized diagram of one implementation of a method for efficiently capturing data by sequential circuits across multiple operating conditions.

Referring now to FIG. 5, one implementation of a method 500 is shown for efficiently capturing data by sequential circuits across multiple operating conditions. For purposes of discussion, the steps in this implementation are shown in sequential order. However, in other implementations some steps occur in a different order than shown, some steps are performed concurrently, some steps are combined with other steps, and some steps are absent.

An integrated circuit includes multiple signal arrival adjuster both at its I/O boundaries and within its die. In various implementations, one or more of the signal arrival adjusters utilize the components of the signal arrival adjuster 120 (of FIG. 1) and the signal arrival adjuster 220 (of FIG. 2). A sequential circuit receives an input data signal (block 502). Examples of the sequential circuit are latches, flip-flops, word line drivers, bit line drivers, data storage memory cells in random access memory, and so on. Generally, the sequential circuit has an associated overhead including setup time and hold time requirements. The sequential circuit receives a power supply voltage (block 504).

A signal arrival adjuster receives an input clock signal (block 506). The signal arrival adjuster receives an indication of a setup/hold selector control signal (block 508). In various implementations, a control unit identifies the combination of one or more operating conditions that cause a setup time violation for the sequential circuit. If the state of the control signal indicates the sequential circuit is setup time limited ("setup time limited" branch of the conditional block 510), then the signal arrival adjuster generates an output clock signal based on the input signal through a first timing path with a first latency greater than a second latency (block 512). For example, the first latency of the first timing path within the signal arrival adjuster is greater than a second latency of a second timing path with the signal arrival adjuster.

Otherwise, if the state of the control signal indicates the sequential circuit is hold time limited ("hold time limited" branch of the conditional block 510), then the signal arrival adjuster generates an output clock signal based on the input signal through a second timing path with a relatively a second latency less than a first latency of the first timing path of the signal arrival adjuster (block 514). The signal arrival adjuster (or adjuster) conveys the output clock signal to the sequential circuit (block 516). For example, the sequential circuit receives the output clock signal as its input clock signal. Due to the received state of the control signal, the adjuster provides a difference between the arrival times at the sequential circuit of the output data signal and of the clock signal to be less than a time threshold. Therefore, both the setup time and the hold time requirements of the sequential circuit are met.

Figure 6:
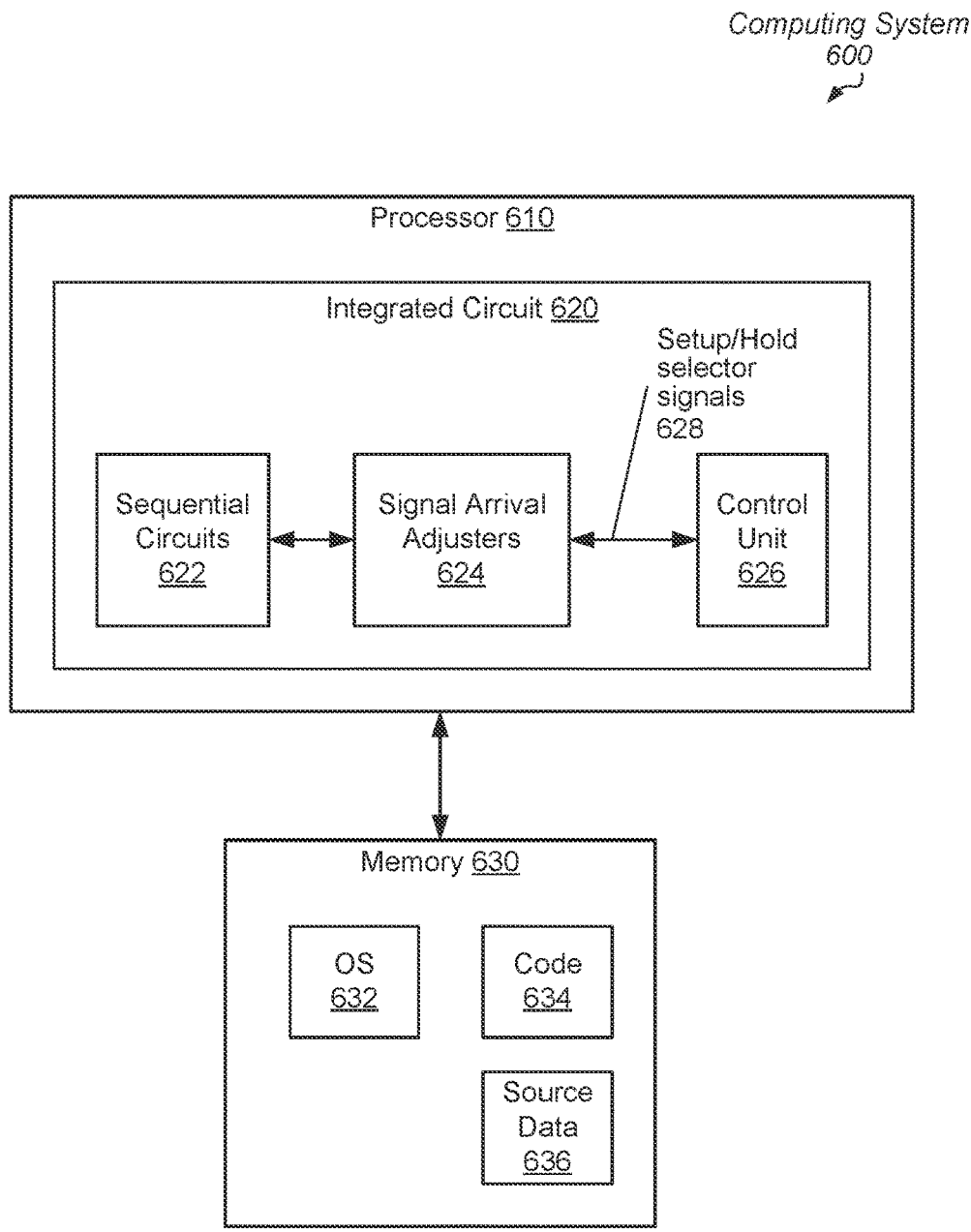
FIG. 6 is a generalized diagram of a computing system with timing paths for capturing data by sequential circuits across multiple operating conditions.

Turning now to FIG. 6, a generalized block diagram is shown of computing system 600 with timing paths for capturing data by sequential circuits across multiple operating conditions. The computing system 600 includes the processor 610 and the memory 630. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 600 includes one or more of other processors of a same type or a different type than processor 610, one or more peripheral devices, a network interface, one or more other memory devices, and so forth. In some implementations, the functionality of the computing system 600 is incorporated on a system on chip (SoC). In other implementations, the functionality of the computing system 600 is incorporated on a peripheral card inserted in a motherboard. The computing system 600 is used in any of a variety of computing devices such as a desktop computer, a tablet computer, a laptop, a smartphone, a smartwatch, a gaming console, a personal assistant device, and so forth.

The processor 610 includes hardware such as circuitry. For example, the processor 610 includes at least one integrated circuit 620, which utilizes sequential circuits 622, signal arrival adjusters 624 (or adjusters 624), and control unit 626. The control unit generates the setup/hold selector signals 628 and sends them to the adjusters 624. The integrated circuit 620 includes the sequential circuits 622 and the corresponding adjusters 624 both at its I/O boundaries and within its die. One or more of the adjusters 624 utilize the circuitry and functionality of the adjusters 120 (of FIG. 1) and the adjusters 220 (of FIG. 2). It is contemplated that the integrated circuit 620 includes any number of adjusters.

In some implementations, each of the adjusters 624 receives a respective signal of the setup/hold selector signals 628. In other implementations, two or more of the adjusters 624 share a particular signal of the setup/hold selector signals 628. One or more of the adjusters 624 are used on a data signal path of corresponding ones of the sequential circuits 622. Other adjusters 624 are used on a clock signal path of corresponding ones of the sequential circuits 622. The control unit 626 determines the values of the setup/hold selector signals 628 based on which combinations of operating conditions cause arrival times of data and clock signals at the sequential circuits 622 to deviate from one another by more than a time threshold. As described earlier, examples of the operating conditions are the operating temperature, the multiple power-performance states (P-states), the operating power supply voltage, a monitored activity level, and so on. The current values of one or more of these conditions change the latencies of signals on the die. Due to the values of the setup/hold selector signals 628 generated by the control unit 626, each of the adjusters 624 provides a difference between the arrival times at a corresponding one of the sequential circuits 622 of the data signal and of the clock signal to be less than a time threshold. Therefore, both the setup time and the hold time requirements of the sequential circuits 622 are met.

In various implementations, the processor 610 includes one or more processing units. In some implementations, each of the processing units includes one or more processor cores capable of general-purpose data processing, and an associated cache memory subsystem. In such an implementation, the processor 610 is a central processing unit (CPU). In another implementation, the processing cores are compute units, each with a highly parallel data microarchitecture with multiple parallel execution lanes and an associated data storage buffer. In such an implementation, the processor 610 is a graphics processing unit (GPU), a digital signal processor (DSP), or other.

In some implementations, the memory 630 includes one or more of a hard disk drive, a solid-state disk, other types of flash memory, a portable solid-state drive, a tape drive and so on. The memory 630 stores an operating system (OS) 632, one or more applications represented by code 634, and at least source data 636. Memory 630 is also capable of storing intermediate result data and final result data generated by the processor 610 when executing a particular application of code 634. Although a single operating system 632 and a single instance of code 634 and source data 636 are shown, in other implementations, another number of these software components are stored in memory 630. The operating system 632 includes instructions for initiating the boot up of the processor 610, assigning tasks to hardware circuitry, managing resources of the computing system 600 and hosting one or more virtual environments.

Each of the processor 610 and the memory 630 includes an interface unit for communicating with one another as well as any other hardware components included in the computing system 600. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
a sequential circuit;
control circuitry; and
a signal arrival adjuster; and
wherein the control circuitry is configured to:
receive indications of one or more operating conditions utilized by at least the sequential circuit of the apparatus that cause a change in latencies of signals of the apparatus; and
generate a control signal based on detection of a combination of the one or more operating conditions; and
wherein the signal arrival adjuster comprises circuitry configured to:
receive a first signal that is one of an input clock signal and an input data signal; and
convey, to the sequential circuit, one of a first version of the first signal or a second version of the first signal, based on the control signal, wherein the second version of the first signal is delayed with respect to the first version of the first signal.

2. The apparatus as recited in claim 1, wherein the control signal is configured to select the first version for conveyance, responsive to the change of one or more conditions comprises a relatively low operating voltage.

3. The apparatus as recited in claim 2, wherein a path corresponding to the second version comprises a plurality of circuit elements configured to delay transmission of a signal.

4. The apparatus as recited in claim 3, wherein the circuit elements comprise two or more inverters.

5. The apparatus as recited in claim 4, wherein circuit elements comprise an even number of inverters.

6. The apparatus as recited in claim 1, wherein the control signal is configured to select the second version for conveyance, responsive to the change of one or more conditions comprises a relatively high operating voltage.

7. The apparatus as recited in claim 1, wherein a value of the control signal is selected based at least in part on an operating temperature.

8. A method comprising:
receiving by control circuitry, indications of one or more operating conditions utilized by at least a sequential circuit of an apparatus that cause a change in latencies of signals of an integrated circuit; and
generating, by the control circuitry, a control signal based on detection of a combination of the one or more operating conditions; and
receiving, by circuitry of a signal arrival adjuster, a first signal that is one of an input clock signal and an input data signal of a computing system; and
conveying, to the sequential circuit by the signal arrival adjuster, one of a first version of the first signal or a second version of the first signal, wherein the second version of the first signal is delayed with respect to the first version of the first signal.

9. The method as recited in claim 8, wherein the control signal is configured to select the first version for conveyance, responsive to the change of one or more conditions comprises a relatively low operating voltage.

10. The method as recited in claim 9, wherein a path corresponding to the second version comprises a plurality of circuit elements configured to delay transmission of a signal.

11. The method as recited in claim 10, wherein the circuit elements comprise two or more inverters.

12. The method as recited in claim 11, wherein circuit elements comprise an even number of inverters.

13. The method as recited in claim 8, wherein the control signal is configured to select the second version for conveyance, responsive to the change of one or more conditions comprises a relatively high operating voltage.

14. The method as recited in claim 8, wherein a value of the control signal is selected based at least in part on an operating temperature.

15. A computing system comprising:
a memory configured to store instructions of one or more tasks and source data to be processed by the one or more tasks;
an integrated circuit configured to execute the instructions using the source data, wherein the integrated circuit comprises:
a sequential circuit;
control circuitry: and
a signal arrival adjuster; and
wherein the control circuitry is configured to:
receive indications of one or more operating conditions utilized by at least the sequential circuit that cause a change in latencies of signals of the apparatus; and
generate a control signal based on detection of a combination of the one or more operating conditions; and
wherein the signal arrival adjuster comprises circuitry configured to:
receive a first signal that is one of an input clock signal and an input data signal; and
convey, to the sequential circuit, a second signal with a latency determined in part by the control signal.

16. The computing system as recited in claim 15, wherein the signal arrival adjuster is further configured to generate the second signal based on the first signal traversing through a first timing path of a plurality of timing paths, responsive to a relatively high operating temperature.

17. The computing system as recited in claim 16, wherein the signal arrival adjuster is further configured to generate the second signal based on the first signal traversing through a second timing path of the plurality of timing paths, responsive to a relatively low operating voltage.

18. The computing system as recited in claim 17, wherein the first timing path has a first latency greater than a second latency of the second timing path.

19. The computing system as recited in claim 15, wherein:
the first signal is the input data signal; and
the control signal indicates the sequential circuit is hold time limited.

20. The computing system as recited in claim 15, wherein:
the first signal is the input clock signal; and
the control signal indicates the sequential circuit is setup time limited.

* * * * *